(12) United States Patent
Richter et al.

(10) Patent No.: US 7,906,383 B2
(45) Date of Patent: Mar. 15, 2011

(54) STRESS TRANSFER IN AN INTERLAYER DIELECTRIC BY PROVIDING A STRESSED DIELECTRIC LAYER ABOVE A STRESS-NEUTRAL DIELECTRIC MATERIAL IN A SEMICONDUCTOR DEVICE

(75) Inventors: Ralf Richter, Dresden (DE); Andy Wei, Dresden (DE); Manfred Horstmann, Duerrroehrsdorf-Dittersbach (DE); Joerg Hohage, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 31 days.

(21) Appl. No.: 12/045,095

(22) Filed: Mar. 10, 2008

(65) Prior Publication Data

US 2009/0057809 A1   Mar. 5, 2009

(30) Foreign Application Priority Data

Aug. 31, 2007  (DE) .......................... 10 2007 041 210

(51) Int. Cl.
*H01L 21/8238* (2006.01)
*H01L 21/311* (2006.01)
*H01L 21/70* (2006.01)
*H01L 27/085* (2006.01)

(52) U.S. Cl. ......... 438/199; 438/218; 438/694; 257/369; 257/372; 257/499; 257/E21.24; 257/E21.64; 257/E29.255

(58) Field of Classification Search .................. 257/499, 257/E21.24, E29.255, 369, 372, E21.64; 438/694, 218
See application file for complete search history.

(56) References Cited

U.S. PATENT DOCUMENTS

| 7,009,226 | B1 | 3/2006 | Sun ............................ 257/192 |
| 2005/0093078 | A1* | 5/2005 | Chan et al. .................... 257/374 |
| 2005/0263825 | A1* | 12/2005 | Frohberg et al. .............. 257/369 |
| 2006/0091471 | A1* | 5/2006 | Frohberg et al. .............. 257/369 |
| 2006/0189075 | A1* | 8/2006 | Kanno .......................... 438/257 |
| 2006/0261416 | A1* | 11/2006 | Hachimine .................... 257/369 |
| 2007/0001233 | A1* | 1/2007 | Schwan et al. ................ 257/369 |
| 2007/0018203 | A1* | 1/2007 | Atanackovic et al. ......... 257/254 |
| 2007/0108525 | A1 | 5/2007 | Yang et al. .................... 257/351 |
| 2007/0202653 | A1* | 8/2007 | Hoentschel et al. .......... 438/301 |
| 2008/0173908 | A1* | 7/2008 | Junker et al. ................. 257/288 |
| 2008/0203487 | A1* | 8/2008 | Hohage et al. ................ 257/369 |
| 2009/0166814 | A1* | 7/2009 | Hohage et al. ................ 257/640 |

FOREIGN PATENT DOCUMENTS

| DE | 10 2004 026 149 A1 | 12/2005 |
| DE | 10 2005 057 073 A1 | 5/2007 |

OTHER PUBLICATIONS

Jun. 4, 2008 communication from our foreign associate forwarding Official Communication.
Translation of Official Communication Issued Apr. 24, 2008.

* cited by examiner

*Primary Examiner* — Zandra Smith
*Assistant Examiner* — Jeremy J Joy
(74) *Attorney, Agent, or Firm* — Williams, Morgan & Amerson, P.C.

(57) ABSTRACT

By forming a stressed dielectric layer on different transistors and subsequently relaxing a portion thereof, the overall process efficiency in an approach for creating strain in channel regions of transistors by stressed overlayers may be enhanced while nevertheless transistor performance gain may be obtained for each type of transistor, since a highly stressed material positioned above the previously relaxed portion may also efficiently affect the underlying transistor.

28 Claims, 9 Drawing Sheets

STRESS TRANSFER IN AN INTERLAYER DIELECTRIC BY PROVIDING A STRESSED DIELECTRIC LAYER ABOVE A STRESS-NEUTRAL DIELECTRIC MATERIAL IN A SEMICONDUCTOR DEVICE

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 65 nm technology and even further advanced approaches, due to the limited conformal deposition capabilities of the deposition process involved, which may result in respective process non-uniformities during subsequent process steps for patterning the stressed layer and forming contact openings, as will be explained in more detail with reference to FIG. 1a-1c.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on respective gate insulation layers 123, which separate the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising a high intrinsic stress may be formed above the first and second device areas 120A, 120B followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B.

As is evident from FIG. 1a, due to the reduced spacing between neighboring transistor elements, the silicon nitride layer 130 may define a respective surface topography in which tapered recesses, also referred to as seams 132, may be formed between the closely spaced transistor elements, since the spacing between the transistor elements may be in the order of two times a layer thickness of the silicon nitride layer 130, which, in combination with the limited conformal fill behavior, may even result in corresponding defects, such as voids 132A and the like. Moreover, due to the pronounced surface topography at the seams 132, the silicon dioxide layer 131 may have a significantly increased thickness at this area due to locally different deposition conditions compared to other areas, which may further contribute to etch non-uniformities during the subsequent patterning of the layer 130.

Furthermore, in this manufacturing stage, the semiconductor device 100 may comprise a resist mask 103, exposing the first device area 120A, while covering the second device region 120B. In this case, it may be assumed that the intrinsic stress of the silicon nitride layer 130 may be appropriately selected so as to enhance the transistor performance in the second device area 120B.

A typical process flow for forming the semiconductor device 100 as shown in FIG. 1a may comprise the following processes. The gate electrodes 121 and the gate insulation layers 123 may be formed and patterned on the basis of well-established process techniques including advanced photolithography, deposition, oxidation and etch techniques. Thereafter, the drain and source regions 125 may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 Gigapascal (GPa) and even more of compressive stress or up to 1 GPa or even significantly higher of tensile stress, may be created so as to enhance the performance of the transistor in the first device area 120A. Due to the less pronounced conformality of the silicon nitride deposition process above a certain layer thickness and for increased aspect ratios, as may occur in highly scaled devices caused by the reduced distance between the neighboring transistor elements at moderately dimensioned gate heights in densely packed device areas, as shown, the silicon nitride material may merge in the lateral growth direction between closely spaced transistor elements, thereby forming the respective seam 131 or respective overhangs may form, thereby resulting in the void 132A. Thus, in the subsequent deposition of the silicon dioxide layer 132, the local deposition conditions at the seam 131 may result in a non-uniformity of the layer thickness, thereby creating a locally significantly enhanced silicon dioxide thickness, which may even amount to a thickness of up to three to four times the thickness at areas distant from the seam 131. On the other hand, the void 132A may give rise to respective etch non-uniformities in a contact etch process to be performed in a later stage.

After the deposition of the silicon dioxide layer 132, the resist mask 103 may be formed on the basis of well-established photolithography techniques. Next, an appropriately designed etch process may be performed in order to remove a portion of the layers 130 and 131 from the second device area 120B. During the corresponding etch process, the silicon dioxide material of the layer 131 may be removed first, followed by a selective etch process for removing the material of the silicon nitride layer 130, wherein the corresponding etch process may be controlled on the basis of an etch stop layer, if required. Due to the significantly increased layer thickness of the silicon dioxide layer 131 at the seam 132, the material may not be completely removed during the etch process when removing the layer 131, thereby significantly blocking the selective etch chemistry during the subsequent etch process for removing the exposed portion of the silicon nitride layer 130.

Consequently, respective material residuals may remain between the transistors in the first device area 120A, which may result in respective non-uniformities during the further processing, for instance, during the deposition of a further dielectric layer of high intrinsic stress designed to enhance the transistor performance of the transistors in the first device area 120A.

FIG. 1b schematically illustrates the semiconductor device 100 at a further advanced manufacturing stage. As shown, a second dielectric layer 140 may be formed above the first and second device areas 120A, 120B, with a corresponding material residual, also referred to as 132 and consisting of material of the layer 131 and 130, while the respective defects, that is, a void 132A, may still be present in the second device area 120B. Consequently, due to the material residual 132, which may be comprised of different materials and may have a different type of intrinsic stress compared to the surrounding material of the layer 140, as previously explained, the respective stress transfer mechanism may be deteriorated, while, additionally, the residual 132 may provide respective etch non-uniformities in the subsequent patterning sequence for forming respective contact openings. Similarly, the void 132A in the second device region 120B may also result in a reduced stress transfer mechanism, as well as degraded etch uniformity, during the subsequent processing. Furthermore, at the manufacturing stage shown in FIG. 1b, a corresponding resist mask 104 is provided for protecting the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role during the etch process 105, since, in combination with the surface topography generated during the deposition of the layer 130, a substantially complete removal of the exposed portion of the layer 140 may depend on the deposition capabilities of the subsequent deposition for a given device geometry. Hence, the thickness of the layer 140 may have to be within specified limits in order to substantially completely remove the layer 140 of the second device region 120B, and not unduly affect the overall stress transfer mechanism. Thus, a respective high degree of conformality may be required for the deposition of the layer 140 in order to efficiently remove the exposed portion thereof by the process 105, which may be controlled on the basis of the etch indicator 131, thereby requiring a moderately uniform layer thickness for substantially completely removing the material of the layer 140 without unduly removing the material of the layer 130.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS and the like, which may be followed by respective planarization processes, if required. Thereafter, respective contact openings 151 may be formed, which may, in some cases, for instance in dense RAM regions, connect to the device layer at areas located between respective closely spaced transistors. Thus, the corresponding irregularities 132, 132A may also affect the corresponding process, thereby resulting in less reliable contacts or even total contact failures.

As a consequence, upon further device scaling, the respective limitation of deposition processes for dielectric materials of high intrinsic stress may require a significant reduction of the layer thickness to comply with increased aspect ratios encountered in advanced device geometries. However, in this case, the respective strain induced by the stressed dielectric materials may also be significantly reduced, thereby also reducing transistor performance. In other cases, a single layer of stressed material may be provided, thereby enhancing performance of one type of transistors only.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of reduced efficiency of strain-inducing mechanisms in highly scaled transistor elements and/or of respective non-uniformities during the patterning of contact openings by providing a technique in which at least one highly stressed dielectric material may be formed above different types of transistor elements and may subsequently be treated so as to reduce the type of stress above one type of transistor while having a substantial neutral stress behavior above another type of transistor. Moreover, a significant enhancement of transistor performance may also be accomplished for the transistors having formed thereabove the substantially stress-neutral portion of the first dielectric material by exploiting experimental data obtained by the inventors, which indicate that a significant stress transfer into a lower lying transistor element may be accomplished when a highly stressed dielectric material may be deposited on a substantially relaxed material layer. As will be discussed later on in more detail, the drive current capability of N-channel transistors and P-channel transistors may be increased by a significant amount even if a substantially relaxed layer is located directly above the respective transistor element, while a corresponding compressively or tensilely stressed dielectric material may be formed on the substantially relaxed material. Consequently, a first dielectric material may be deposited so as to obtain a substantially void-free coverage of transistor elements of various types, wherein subsequently the intrinsic stress of the dielectric material may be selectively reduced or relaxed on the basis of an appropriate treatment, such as particle bombardment and the like, thereby providing a substantially neutral or stress-free dielectric material. Since removal of the corresponding portion of the initially highly-stressed dielectric material may no longer be necessary, thereby substantially reducing or avoiding the above-described problems involved in performing a conventional dual stress line approach, for transistor elements of the 65 nm technology and less, a further device scaling may be accomplished while providing the potential for enhancing performance of N-channel transistors and P-channel transistors on the basis of stressed overlayers.

One illustrative method disclosed herein comprises forming a first stress-inducing layer above a first transistor and a second transistor, which are formed above a substrate, wherein the first stress-inducing layer generates a first type of stress. The method further comprises reducing a magnitude of the first type of stress of the first stress-inducing layer above the second transistor. Finally, a second stress-inducing layer is formed above the second transistor, wherein the second stress-inducing layer generates a second type of stress that differs from the first type of stress.

A further illustrative method disclosed herein comprises forming a first stress-inducing layer above a first transistor and a second transistor and selectively relaxing an internal stress of the first stress-inducing layer above the second transistor. Furthermore, a second stress-inducing layer is formed above the first and second transistors and internal stress thereof is selectively relaxed above the first transistor.

One illustrative semiconductor device disclosed herein comprises a first dielectric layer formed above a first transistor and a second transistor, wherein the first dielectric layer has a stress-inducing portion above the first transistor and has a substantially relaxed portion above the second transistor. Moreover, a semiconductor device further comprises a second dielectric layer formed above at least one of the first and second transistors, wherein the second dielectric layer has a stress-inducing portion formed above the substantially relaxed portion of the first dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1A:
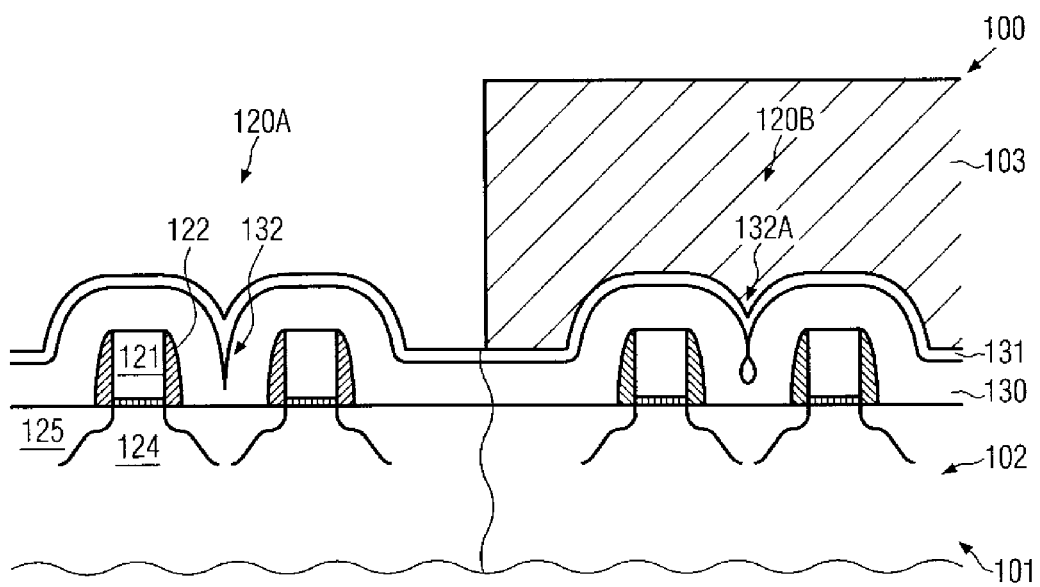
FIGS. 1a-1c schematically illustrate cross-sectional views of a semiconductor device during various manufacturing stages in forming differently stressed contact etch stop layers, wherein the semiconductor device includes densely spaced transistor elements, according to conventional techniques.
Figure 1B:
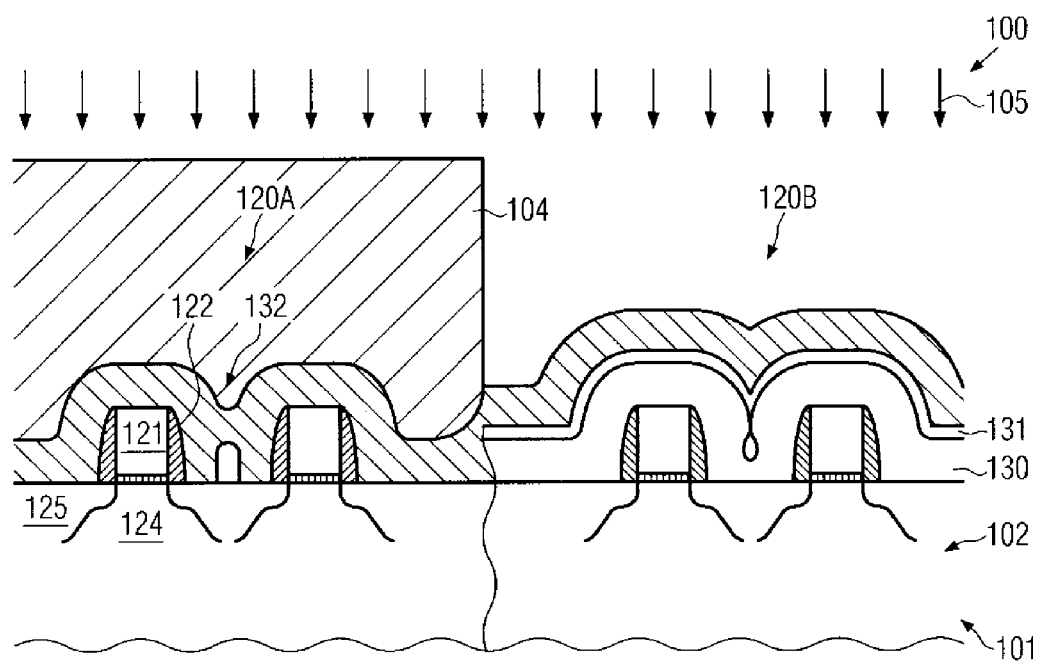
Figure 1C:
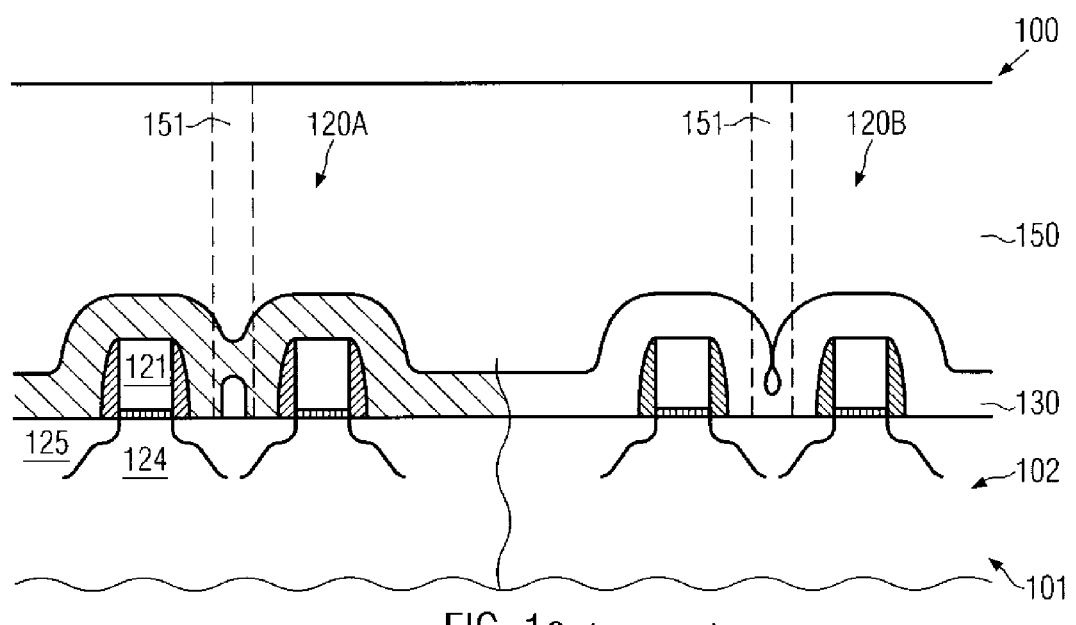

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to an enhanced process technique and a respective semiconductor device in which stress-inducing layers may be formed above respective device regions including densely spaced transistor elements on the basis of the results of investigations performed by the inventors which seem to indicate that a pronounced gain in transistor performance may be obtained when a highly stressed dielectric material is formed on a substantially relaxed or stress-free material. Consequently, the techniques and devices disclosed herein provide the possibility of depositing dielectric material on the basis of process parameters so as to comply with the surface topography caused by highly scaled transistor elements, for instance, when densely spaced device regions are considered, while substantially reducing any negative impacts that may be encountered in conventional dual stress line approaches, as previously described. Due to the principles disclosed herein, a highly stressed dielectric material may be deposited on the basis of process parameters selected such that undesired voids or other surface irregularities may be substantially avoided or the occurrence thereof greatly reduced, wherein the respective internal stress may be significantly reduced or relaxed at appropriate device regions, which may subsequently receive a further stress-inducing dielectric material on the basis of less pronounced deposition restrictions, while nevertheless providing a desired gain in performance of the transistor elements under consideration. That is, contrary to conventional dual stress line approaches, which are typically based on the concept that a highly stressed dielectric material initially formed above respective transistor elements may have to be removed at device areas, in which the initial intrinsic stress might detrimentally affect the transistor performance. Consequently, in these techniques, sophisticated etch regimes may be required for removing unwanted portions of the initially deposited material with a subsequent deposition of a further highly stressed dielectric material, wherein very strict constraints are to be met, which may result in an increased probability of creating the irregularities as previously described in this specification. Contrary to these concepts, the techniques disclosed herein enable the formation of a highly stressed material followed by a subsequent stress relaxation and the further deposition of a highly stressed material, thereby providing the desired strain-inducing mechanism above the previously relaxed portion, wherein, in some illustrative embodiments, this sequence may be appropriately repeated, depending on the process and device requirements. Consequently, the process technique described herein may be applied to highly scaled transistor devices including transistor elements having a gate length of 50 nm and significantly less, thereby enabling the extension of the strain-inducing mechanism provided by overlying dielectric materials to future device generations. In other cases, the principles disclosed herein may also be applied to less critical applications, wherein a significantly simplified process sequence may be obtained, while nevertheless providing the desired gain in performance of different types of transistors.

As previously indicated, the techniques disclosed herein take advantage of investigations, the results of which seem to indicate that transistor performance may strongly be affected by a stack of dielectric material in which a substantially relaxed or stress-free material is provided above a transistor element followed by a highly stressed dielectric material. Thus, contrary to conventional approaches, in which a highly stressed dielectric material is positioned as close to the transistor as possible, the measurement results seem to indicate that a significant increase of transistor operating speed may be accomplished for the above-specified stack, wherein the respective experimental data seem to be valid at least for transistor elements having a gate length of approximately 50 nm and less.

Figure 2B:
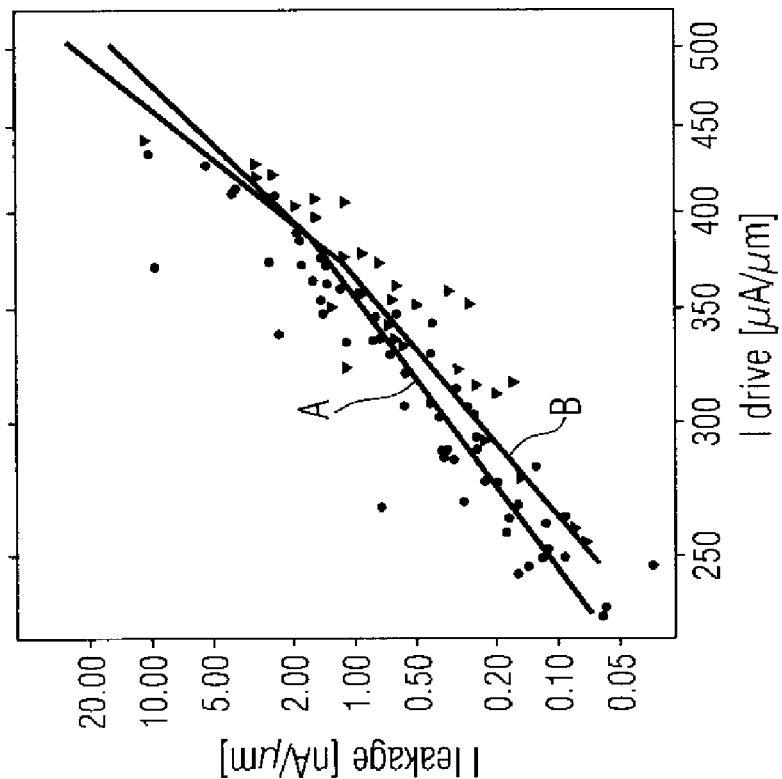
FIGS. 2a-2b schematically illustrate measurement results obtained from N-channel transistors (FIG. 2a) having formed thereon a substantially relaxed dielectric material followed by a dielectric material of high tensile stress, and of a P-channel transistor (FIG. 2b) having formed thereabove a substantially stress-free dielectric material followed by a highly compressively stressed dielectric material, thereby illustrating advantages obtained by the principles of the subject matter disclosed herein.
Figure 2A:
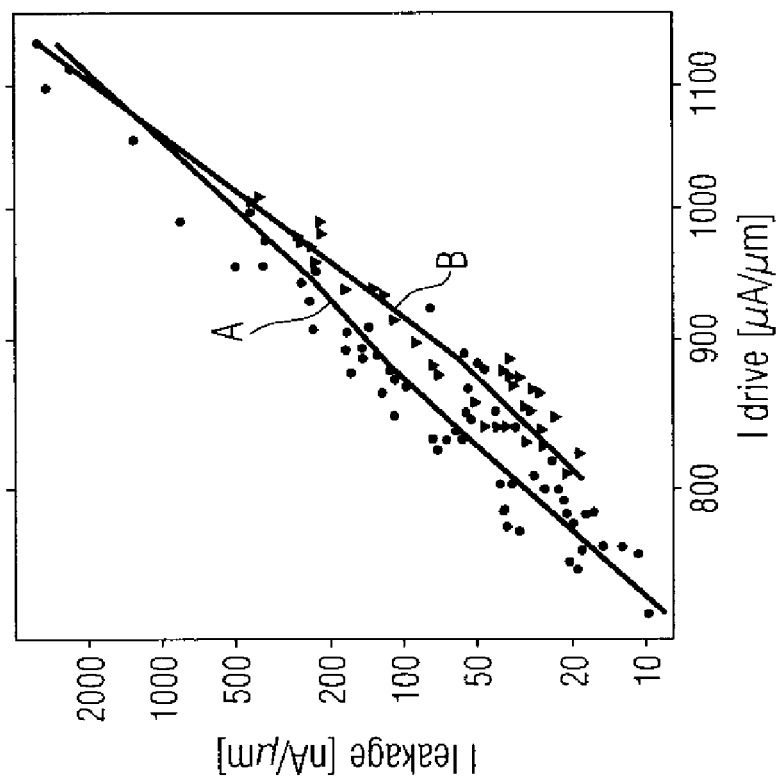

FIG. 2a schematically illustrates a respective graph for characterizing performance of N-channel transistors, wherein respective measurement results are illustrated in a schematic manner. In the graph shown in FIG. 2a, the horizontal axis may represent the drive current of transistors, i.e., the current flowing from the drain to the source via a respective channel region of a transistor, wherein a corresponding "gate current" may be required, which is plotted against the vertical axis. Typically, a substantially exponential dependency of the gate leakage currents may be observed with respect to an increase of the respective drive currents, wherein an enhanced transistor performance may be obtained, when higher drive currents are achieved at reduced gate leakage currents. For example, curve A in FIG. 2a may represent a fitted progression of measurement results obtained for transistor elements having formed thereon a substantially stress-free dielectric material, such as a silicon nitride, wherein a thickness of approximately 100 nm has been used. Similarly, curve B represents a fit of the measurement data obtained from transistor elements having substantially the same configuration as the comparison elements, except for a layer stack including a 110 nm substantially stress-free dielectric layer followed by an 80 nm dielectric material of high intrinsic stress in the range of approximately 1-1.5 Giga Pascal. As is qualitatively evident from FIG. 2a, for a wide range of drive currents, for instance, from approximately 800 micro ampere per micro meter to 1000 micro ampere per micro meter, the transistor elements corresponding to curve B provide reduced leakage currents, thereby indicating enhanced transistor performance.

FIG. 2b schematically illustrates respective curves A and B of measurement results for P-channel transistors comprising layers of essentially stress-free dielectric material with a thickness of approximately 110 nm (curve A), while curve B represents the results of a layer stack comprising a substantially neutral layer of 100 nm followed by an 80 nm thick compressive dielectric material with an internal stress level of approximately 2 Giga Pascal or higher. Also, in this case, an increased drive current may be observed for the transistor devices having the layer stack, thereby also indicating that a substantial influence of the compressively stressed dielectric material on the transistor performance may be obtained even when "shielded" by the substantially neutral layer. It should be appreciated that, generally, the drive currents per unit length with respect to the transistor width direction are significantly less compared to the situation shown in FIG. 2a due to the generally lower mobility of holes compared to the mobility of electrons.

Thus, based on the experimental data, indicating an efficient stress transfer via a substantially stress-free layer, an appropriate technique may be used in which performance gain may be obtained for N-channel transistors and P-channel transistors, as will be described in more detail with reference to FIGS. 3a-5d.

Figure 3A:
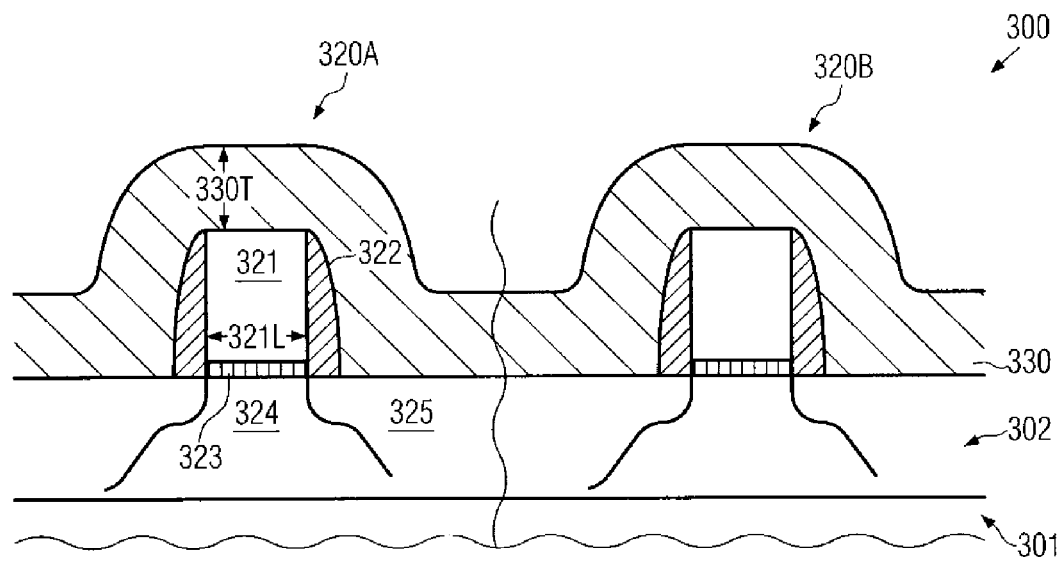
FIGS. 3a-3e schematically illustrate cross-sectional views of a semiconductor device comprising two different transistor types during various manufacturing stages for receiving dielectric materials of different intrinsic stress, wherein at least a portion of the dielectric material is formed on or above a substantially stress-free dielectric material, according to illustrative embodiments.

FIG. 3a schematically illustrates a cross-sectional view of a semiconductor device 300 which may comprise a substrate 301 that may represent any appropriate carrier material, such as a semiconductor bulk substrate, for instance based on silicon, or an insulating material having formed thereon a substantially crystalline semiconductor layer 302, thereby forming a respective SOI configuration. It should further be appreciated that the semiconductor device 300 may comprise other device regions, in which a different transistor architecture may be used, that is, a bulk configuration or an SOI configuration, so that both transistor architectures may be concurrently realized in the semiconductor device 300. For example, in the embodiment shown, a semiconductor device 300 may comprise a first device region 320A, which may also represent a first transistor, which may, for convenience, also be denoted by the reference number 320A. Similarly, a second device region 320B may be provided, which may also be represented by a transistor, also indicated as 320B, wherein the first and second device regions or transistors 320A, 320B may require a different type of strain-inducing mechanism in order to individually enhance transistor performance. It should be appreciated that the configuration of the transistors 320A, 320B may be different, for instance with respect to gate dielectrics, transistor width, gate length, conductivity type and the like. For convenience, any such differences are not shown in FIG. 3a, while nevertheless it may be assumed that the transistors 320A, 320B may require a different type of external stress acting thereon so as to obtain the desired increase of transistor performance.

In the embodiment shown, each of the transistors 320A, 320B may comprise a gate electrode structure 321 that is formed on a gate insulation layer 323, which may be comprised of any appropriate material, such as silicon dioxide based materials, high k-dielectrics and the like. The gate insulation layer 323 separates the gate electrode 321 from a respective channel region 324, which may typically include silicon material, so that the conductivity of the channel region may be efficiently increased by inducing an appropriate type of strain therein. Furthermore, the channel regions 324 may be laterally bordered by drain and source regions 325, wherein, in the drain and source regions 325 and/or in the channel region 324, appropriate materials may be incorporated so as to further enhance the charge carrier mobility in the channel region 324. For convenience, any such materials, such as embedded silicon/germanium alloys, silicon/carbon alloys, silicon/tin alloys and the like, are not shown. Similarly, the material of the channel region 324 may be provided in a strained state due to a stress memorization technique performed in an earlier manufacturing stage. That is, in a previous manufacturing stage, the drain and source regions and/or the channel region 324 or at least portions thereof may have been amorphized and may have been re-crystallized on the basis of a stressed or rigid material, thereby creating a specific strain in the channel region 324, which may even be maintained, at least to a certain degree, after removing the respective rigid material completely or partially, depending on the process and device requirements. Furthermore, the transistors 320A, 320B may comprise a sidewall spacer structure 322, which may include a plurality of individual spacer elements in combination with respective liners, depending on the overall device requirements. In other cases, the sidewall spacer structure 322 may be removed at this manufacturing stage, thereby enabling the positioning of a highly stressed material more closely to the channel region 324. Furthermore, the gate electrodes 321 may comprise a metal-containing material, such as a metal silicide, or any other appropriate metal materials, depending on the device requirements. Furthermore, at this manufacturing stage, a dielectric layer 330 exhibiting a desired high intrinsic stress may be formed above the first and second transistors 320A, 320B, wherein it may be assumed that the intrinsic stress of the layer 330 may be selected such that performance of the transistor 320A may be increased. For example, the transistor 320A may represent a P-channel transistor formed on the basis of a typical crystalline configuration of the semiconductor layer 302, i.e., the semiconductor layer 302 may have a (100) surface orientation with the channel region 324 being oriented with its length direction in an <110> crystal direction. It should be appreciated that the length direction of the channel region 324 is represented by the horizontal direction in FIG. 3a, wherein a length of the channel 324 may be associated with a respective gate length 321L, which may be in the range of 50 nm and significantly less in sophisticated applications. For instance, for transistor devices according to the 65 nm technology, the respective gate length 321L may be approximately 40 nm and less. The dielectric layer 330 may be comprised of silicon nitride, silicon carbide or any other appropriate material providing the desired high intrinsic stress. As previously discussed, for sophisticated applications, a pronounced surface topography may be obtained, in particular in densely packed device areas, as will be described later on with reference to FIGS. 4a-4b. Consequently, the dielectric layer 330 may have a thickness 330T that is compatible with gap filling capabilities of the corresponding deposition process so as to substantially avoid the creation of any irregularities, such as voids and the like, as previously explained. For example, in a less critical application, the thickness 330T may be approximately 150 nm and less, while, in sophisticated applications, for instance when the device 300 represents a product of the 65 nm technology node, the thickness 330T may be approximately 50 nm and less.

The semiconductor device 300 as shown in FIG. 3a may be formed on the basis of the following processes. The transistors 320A, 320B may be formed on the basis of substantially the same process techniques as previously described for the transistors in the first and second device regions 120A, 120B. After the completion of the basic transistor structures, the dielectric layer 330 may be deposited, for instance, on the basis of PECVD techniques, wherein the process parameters are appropriately selected to obtain the desired type and magnitude of the internal stress, as previously explained. Furthermore, the target thickness is selected such that the thickness 330T may result in a substantial conformal deposition substantially without causing any surface irregularities or voids. In some illustrative embodiments, the dielectric layer 330 may be directly formed on the respective transistors 320A, 320B, that is, the material of the layer 330 may directly contact the drain and source regions 325, for instance any metal silicide regions formed therein, and may also directly contact the gate electrode 321. In other cases, a thin buffer layer (not shown) may be formed prior to the deposition of the dielectric layer 330, which may be performed on the basis of any appropriate deposition process technique, in which the internal stress may be less critical, since the desired stress-inducing mechanism may be provided by the layer 330. In this case, the additional buffer layer may provide a less pronounced surface topography, which may be advantageous in densely packed device regions, as will be described later in more detail. It should be appreciated, however, that, due to the fact that the dielectric layer 330 may be maintained above the second transistor 320B, respective etch stop materials and the like, which may typically be provided in dual stress line approaches, may be omitted, thereby reducing overall process complexity.

Figure 3B:
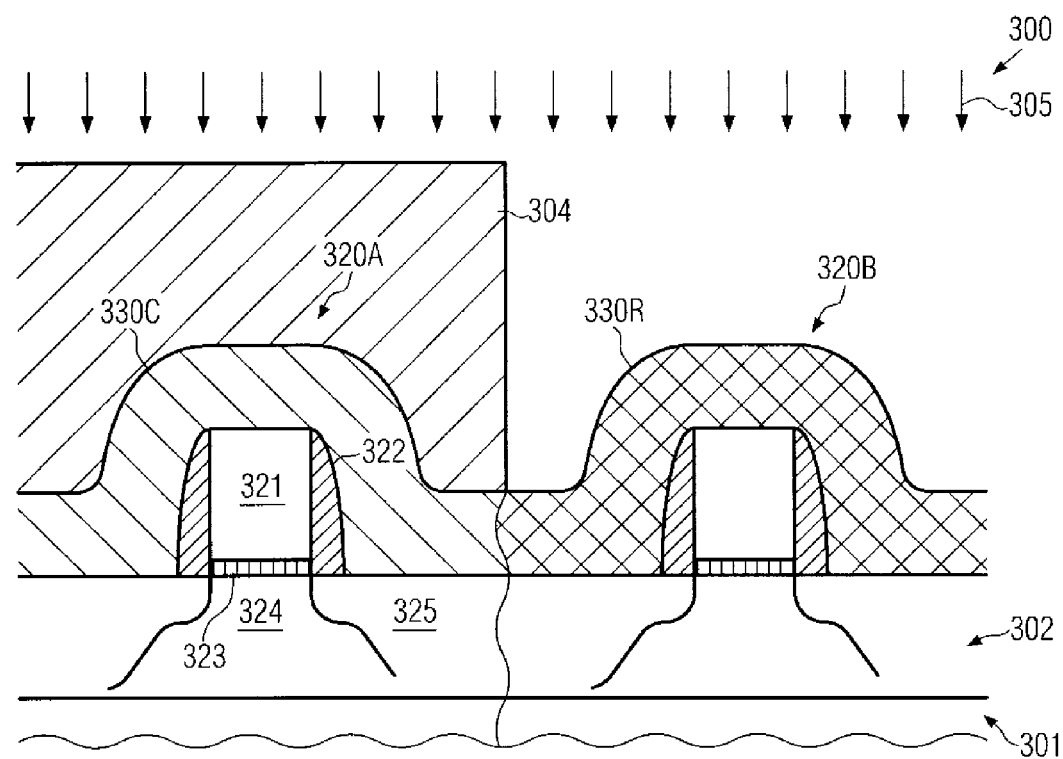

FIG. 3b schematically illustrates the semiconductor device 300 in a further advanced manufacturing stage, in which a mask 304 is provided, for instance, in the form of a resist mask, to cover the first transistor 320A while exposing the second transistor 320B, i.e., a portion of the layer 330 formed thereon. The semiconductor device 300 may be exposed to a treatment 305 designed to significantly reduce the magnitude of the internal stress of the dielectric layer 330, wherein, in some illustrative embodiments, the treatment 305 may include a particle bombardment, for instance, an ion implantation process, which may efficiently alter the molecular structure of the exposed portion of the layer 330, thereby efficiently relaxing the internal strain. For example, appropriate process parameters for the treatment 305, when performed on the basis of an ion implantation process, may be readily obtained on the basis of experience, simulations, experimental data and the like. For example, any appropriate ion species, such as xenon, krypton and the like, may be used, thereby causing heavy damage in the exposed portion of the layer 330 at moderate implantation dose levels. Consequently, after the treatment 305, the dielectric layer 330 comprises a first portion 330A, which may exhibit a moderately high internal stress, such as a compressive stress or a tensile stress, depending on the configuration of the transistor 320A, and a second portion 330R in which the internal stress is substantially relaxed or the magnitude thereof is at least significantly reduced. After the treatment 305, the mask 304 may be removed, for instance, on the basis of well-established techniques, and a further dielectric material may be subsequently deposited.

Figure 3C:
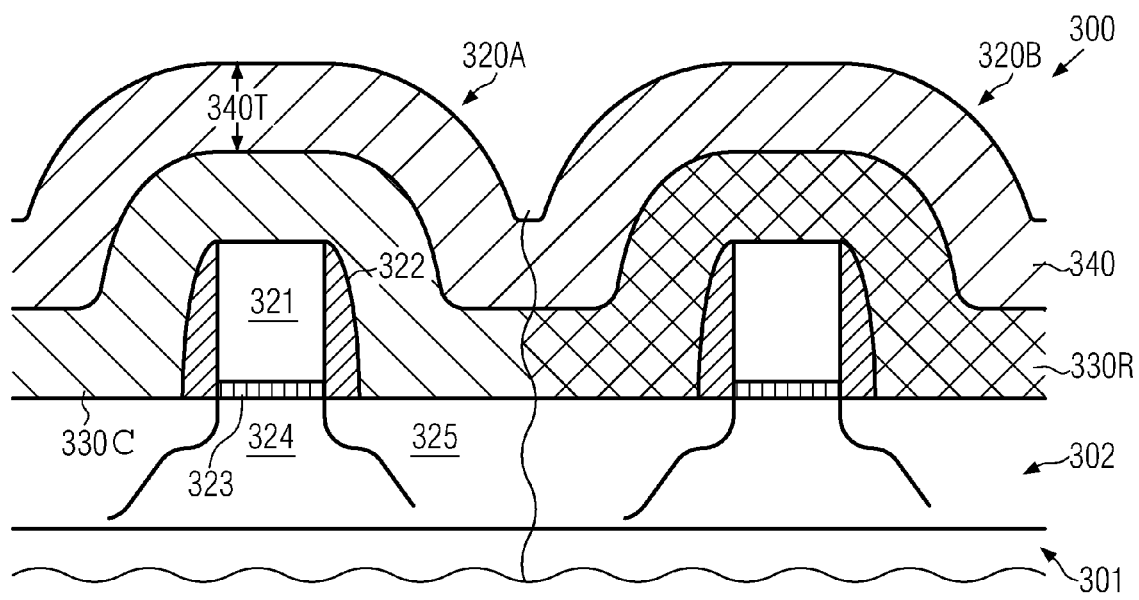

FIG. 3c schematically illustrates the semiconductor device 300 after the deposition of a further dielectric material 340, which may exhibit a high internal stress that is appropriate for enhancing the performance of the transistor 320B. In one illustrative embodiment, the dielectric layer 340 may be deposited directly on the previously formed layer 330, when the resulting surface topography obtained after the deposition of the layer 330 may be appropriate for a substantially void-free deposition of the layer 340. Moreover, in some illustrative embodiments, the dielectric layer 340 may be maintained after deposition, except for a selective reduction of internal stress, so that respective etch processes, which may possibly require etch indicator materials or etch stop materials, may be omitted. In other cases, an appropriate buffer material may be deposited prior to the deposition of the layer 340, wherein an appropriate material or deposition technique may be used, in which the surface topography may be "leveled" to a certain degree so as to relax the constraints of the subsequent deposition process for forming the highly stressed dielectric layer 340. In some illustrative embodiments, the deposition of the layer 330 may have been performed on the basis of an appropriate thickness, such as the thickness 330T, which may substantially avoid the creation of voids, while nevertheless reducing the resulting pronounced surface topography, thereby enabling the deposition of the layer 340 on the basis of less critical deposition parameters, which may thus allow the deposition of an increased thickness, thereby providing a highly efficient stress-inducing mechanism for the second transistor 320B.

Figure 3D:
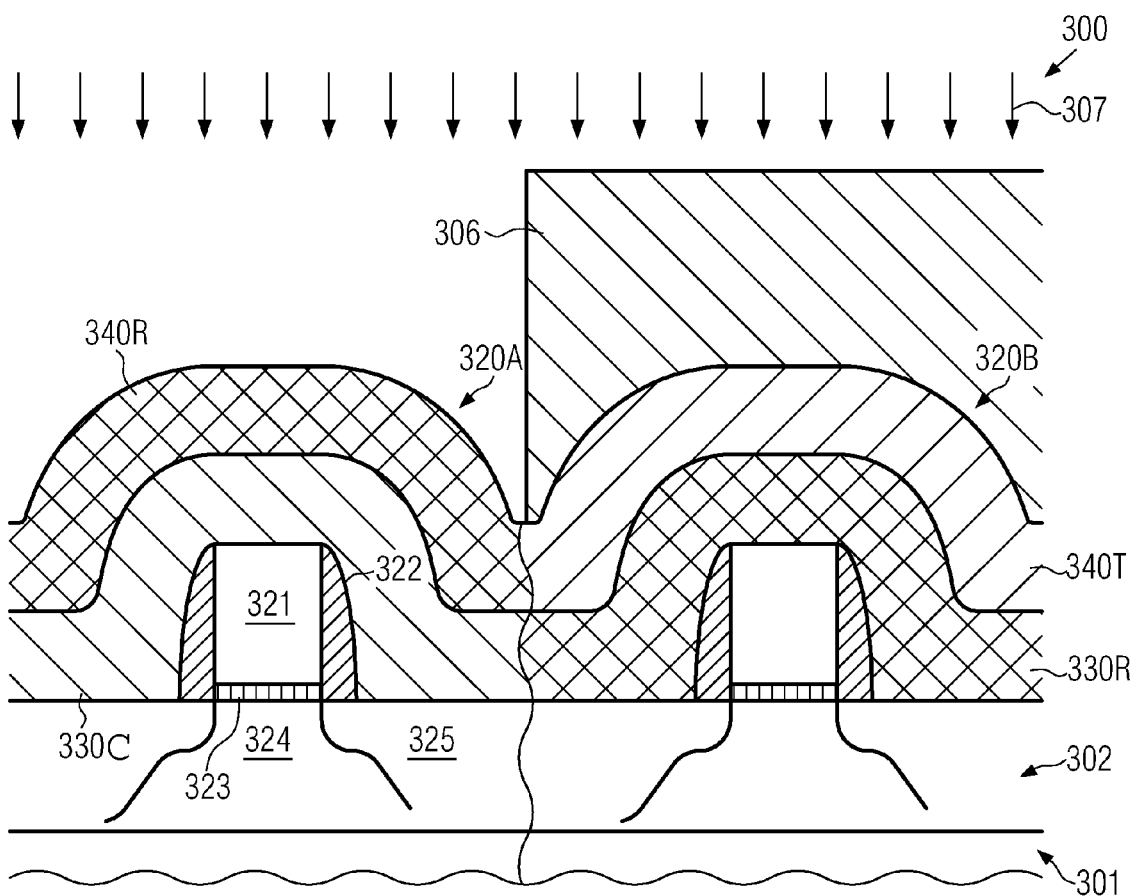

FIG. 3d schematically illustrates the semiconductor device 300 in a further advanced manufacturing stage, in which a mask 306, for instance, a resist mask, is provided to cover the second transistor 320B and the corresponding portions of the dielectric layers 330 and 340, while exposing the respective portions above the first transistor 320A. Furthermore, the semiconductor device 300 may be exposed to a further treatment 307, such as a particle bombardment, for instance, in the form of an ion implantation process, the process parameters of which are selected such that an internal stress of the dielectric layer 340 formed above the first transistor 320A may be significantly reduced or relaxed, thereby forming a portion 340R, while a portion 340T may maintain its initial internal stress, which may be a tensile stress, if the dielectric layer 330 has been provided with a compressive stress.

Consequently, after the removal of the mask 306, the semiconductor device 300 comprises a stress-inducing portion 330C above the first transistor 320A and a stress-inducing portion 340T above the second transistor 320B, wherein the respective internal stress of the portion 340T is efficiently transferred into the lower lying transistor 320B via the substantially relaxed portion 330R. It should be appreciated that, in this respect, a "substantially stress-free or relaxed" portion is to be understood as the stress state prior to the deposition of the subsequent layer, since, for instance, the portion 340T may exert a certain degree of stress to the "substantially relaxed" portion 330R, which then acts on the transistor 320B. Nevertheless, the dielectric layer 330 may be considered as a single and continuous material layer, wherein the portion 330C may be identified as a stress-inducing portion, while, in comparison thereto, the portion 330R may be considered as a "substantially relaxed" portion, since an additional external source for creating stress in the portion 340T is required. Hence, a difference in material characteristics may be identified in the portions 330C and 330R, irrespective of the precise levels of the prevailing internal stress level. Similar considerations also apply to the dielectric layer 340.

In one illustrative embodiment, the further processing of the semiconductor device 300 may be continued on the basis of the device configuration corresponding to the device of FIG. 3d, i.e., an appropriate further dielectric material, also referred to as inter-layer dielectric material, may be formed on the basis of an appropriate deposition technique, as previously explained with reference to the semiconductor device 100, and thereafter appropriate contact openings may be formed, as previously discussed, wherein respective irregularities may be significantly reduced, thereby enhancing production yield for highly sophisticated semiconductor devices.

Figure 3E:
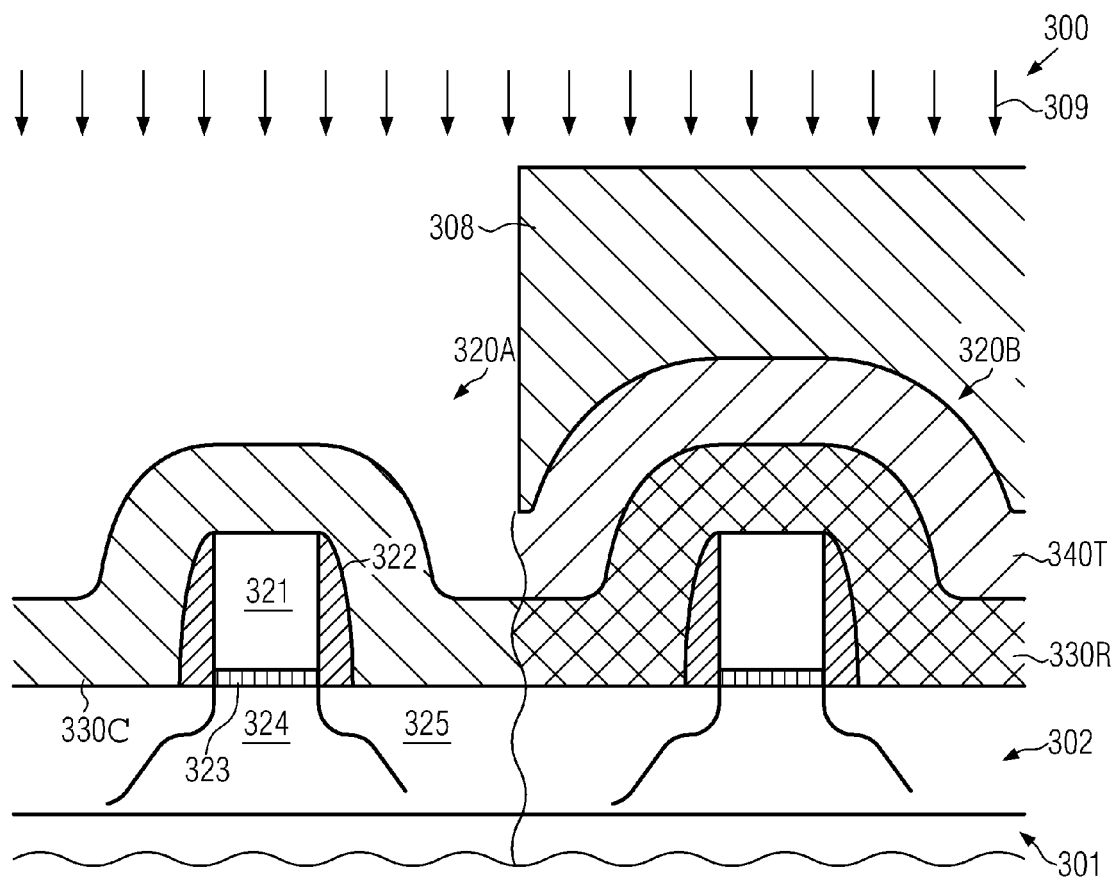

FIG. 3e schematically illustrates a cross-sectional view of the semiconductor device 300 in accordance with further illustrative embodiments, in which a further mask 308 may be provided to cover the second transistor 320B and the associated dielectric portion 330R and 340T while exposing the first transistor 320A and the associated portion 340R to an etch ambient 309. During the etch process 309, the exposed portion of the layer 340 as shown in FIG. 3c may be removed, thereby removing any material of high intrinsic stress that may compromise the effect of the underlying portion 330C. For this purpose, well-established etch recipes may be used, wherein the material of the layer 340 may be removed on the basis of a time-controlled etch process, thereby providing enhanced process efficiency, since any measures for incorporating etch stop or etch indicator materials may be omitted. In other illustrative embodiments, the deposition of the layer 340 may be performed on the basis of process gases, which may enable the incorporation of a prominent etch indicator material into the layer 340, thereby enabling the detection of pronounced endpoint detection signal, which may drastically drop in intensity, when the respective etch front reaches the lower lying portion 330C. In other cases, prior to the deposition of the layer 340, an appropriate etch indicator layer may be formed, for instance, by surface treatment of the previously deposited layer 330R or by depositing an appropriate material, which may also act as a buffer layer for reducing the pronounced surface topography, as will be described later on. Thus, after the removal of the mask 308, the further processing may be continued by forming an appropriate inter-layer dielectric material and forming respective contact openings, as previously discussed.

Figure 4A:
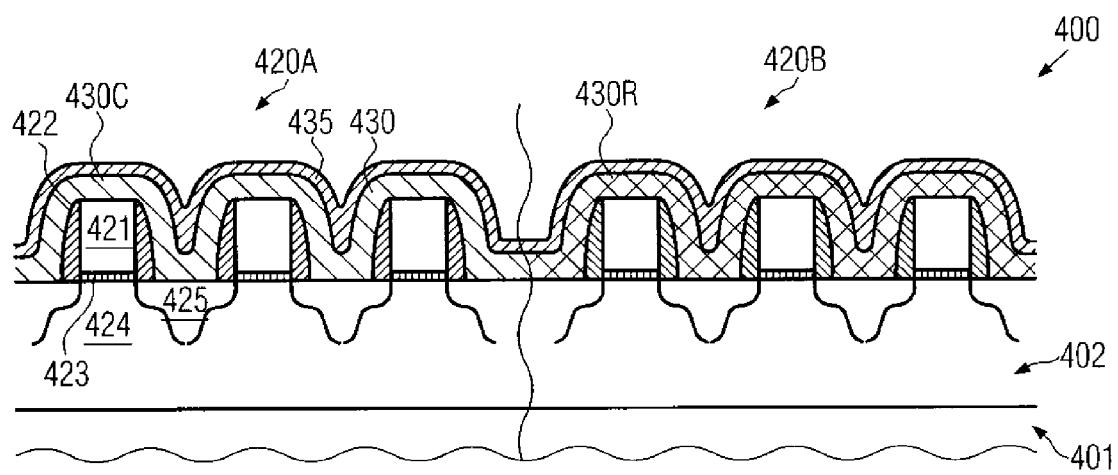
FIGS. 4a-4b schematically illustrate cross-sectional views of a semiconductor device including a plurality of densely spaced transistor elements receiving respective stress-inducing layers according to further illustrative embodiments, wherein a buffer layer may be provided to reduce the pronounced surface topography prior to the deposition of a further stress-inducing material.
Figure 4B:
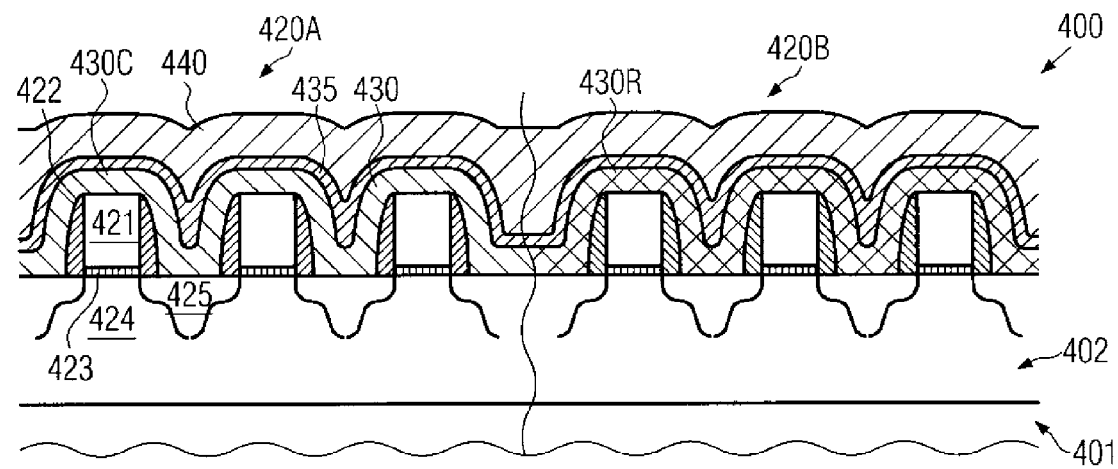

With reference to FIGS. 4a-4b, further illustrative embodiments will now be described in more detail, in which a buffer layer may be provided, at least after the deposition of a first stress-inducing layer in order to enhance the efficiency of the further processing.

FIG. 4a schematically illustrates a semiconductor device 400, which may comprise a first device region 420A and a second device region 420B. One or both of the device regions 420A, 420B may comprise a plurality of densely packed transistors, each of which may, in principle, have substantially the same configuration as previously described with reference to the devices 100 and 300. Hence, the semiconductor device 400 may comprise a substrate 401 having formed thereabove a semiconductor layer 402, wherein, for these components, the same criteria apply as previously explained with reference to the devices 100 and 300. Similarly, a plurality of transistors in the first and second device regions 420A, 420B may each comprise a gate electrode 421 formed on a gate insulation 423 separating the respective gate electrodes 421 from a channel region 424. Furthermore, a sidewall spacer structure 422 may be provided and drain and source regions 425 may be formed in the semiconductor layer 402. Furthermore, a first dielectric layer 430 is formed above the first and second device regions 420A, 420B, wherein a first portion 430C may exhibit a high internal stress so as to enhance the performance of the transistors in the first device region 420A. On the other hand, a portion 430R of the dielectric layer 430 may be formed above the transistors of the second device region 420B and may have a significantly reduced internal stress and may be considered as a substantially relaxed portion, as previously explained. Moreover, due to the reduced distance between neighboring gate electrode structures of adjacent transistors, a pronounced topography may be caused in the regions 420A, 420B, wherein a thickness of the layer 430 may be selected so as to obtain a substantially void-free deposition behavior, as previously explained. For example, for sophisticated applications, a thickness of the layer 430 may be 50 nm and less. While, in other cases, when a gate length of the transistor is in the range of 50 nm, thereby corresponding to a distance of approximately 300 nm, the thickness may be 150 nm and less. Moreover, the semiconductor device 400 may comprise a buffer layer 435, which may have any appropriate internal stress level, such as a stress corresponding to the internal stress of the portion 430C or may have an internal stress level corresponding to the internal stress of a further dielectric layer still to be deposited in order to enhance the transistor performance in the second device region 420B. In still other illustrative embodiments, the buffer layer 435 may have a substantially neutral stress behavior. For example, the buffer layer 435 may be formed on the basis of a deposition technique, which is basically selected in view of reducing the surface topography rather than providing a specified internal stress. In one illustrative embodiment, the buffer layer 435 may be provided in the form of a material composition other than the material of the layer 430, thereby enabling the selection of appropriate deposition techniques, resulting in a less conformal deposition behavior with superior gap filling capability while nevertheless avoiding the creation of any void. For instance, silicon dioxide may be deposited in a "flow-like" manner, thereby appropriately filling respective gaps between adjacent gate electrode structures and hence reducing the constraints for a subsequent deposition of a highly stressed material. In other illustrative embodiments, the buffer layer 435 may be provided in the form of a similar material compared to the layer 430, however, with a reduced internal stress level so as to allow the selection of process parameters that provide the desired deposition behavior. The buffer layer 435 may be provided after a corresponding treatment for substantially relaxing the portion 430R, when a respective internal stress of the buffer layer 435 may correspond to the desired type of stress for the second device region 420B. When the buffer layer 435 may comprise an internal stress corresponding to the portion 430C, the buffer layer 435 may be provided prior to the treatment, thereby enabling a significant stress relaxation when forming the portion 430R in a common process sequence.

FIG. 4b schematically illustrates the semiconductor device 400 in a further advanced manufacturing stage, in which a second dielectric layer 440 is formed above the first and second device regions 420A, 420B with an internal stress level that is appropriate for enhancing the transistor performance in the second device region 420B. Due to the less pronounced surface topography obtained by the provision of the buffer layer 435, the corresponding process limitations of the deposition process are less critical and a highly stressed material may be formed with a reduced probability for creating voids or other irregularities, while nevertheless a moderately high layer thickness may be obtained for the layer 440 during a single deposition cycle. Consequently, an efficient stress transfer mechanism may be accomplished in the second device region 420B, even for highly scaled transistor elements, due to the relaxed deposition constraints. Thereafter, the further processing may be continued by, for instance, removing a portion of the layer 440 from above the first device region 420A, wherein, depending on the material composition, the buffer layer 435 may be used as an etch stop layer or an etch indicator layer. In other illustrative embodiments, the portion of the layer 440 located above the first device region 420A may be selectively relaxed, for instance, on the basis of an ion implantation process, as previously discussed, wherein a certain degree of stress relaxation may also be obtained in the buffer layer 435, if this layer has been provided with an intrinsic type of stress that corresponds to the stress of the layer 440. Furthermore, since generally the buffer layer 435 may have a reduced internal stress level or may even be provided in a substantially stress-free state, the buffer layer 435 may also act to avoid non-desired implantation-induced damage in the lower lying portion 430C, thereby reducing the probability of relaxing a surface area of the portion 430C and hence increasing process margins for the respective implantation process.

Figure 5A:
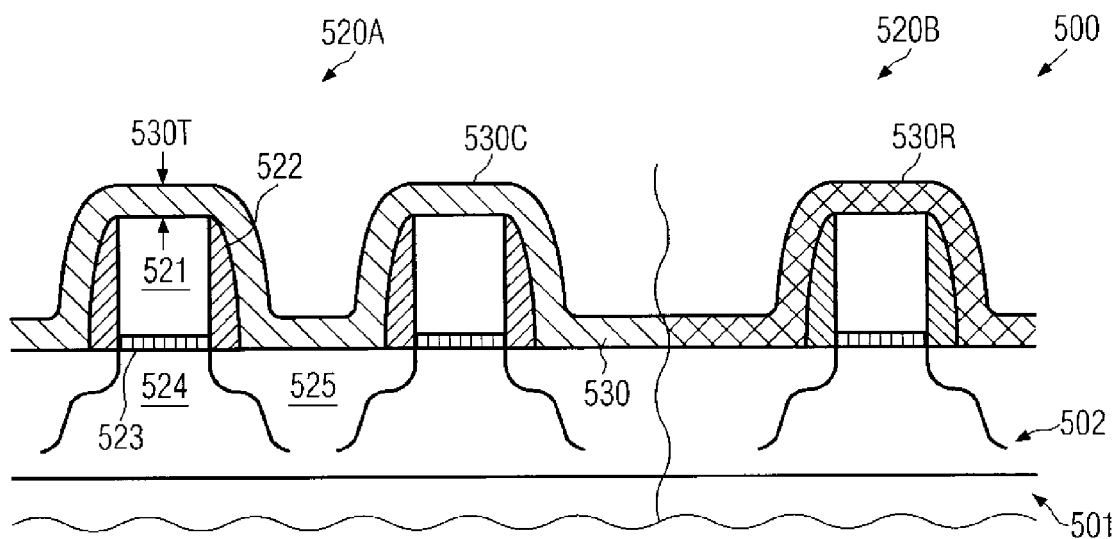
FIGS. 5a-5d schematically illustrate cross-sectional views of a semiconductor device during various manufacturing stages in forming a plurality of stress-inducing layers on the basis of an appropriately selected layer thickness for respecting the gap filling capabilities in view of the given surface topography, wherein respective device portions are alternately subjected to stress relaxation prior to the deposition of a further stress-inducing layer, according to further illustrative embodiments.
Figure 5B:
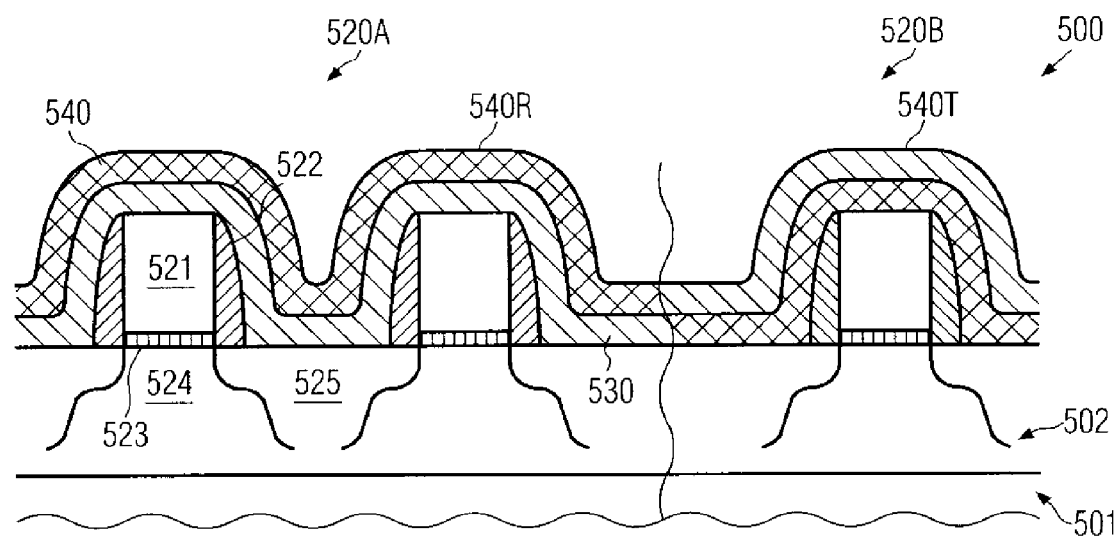
Figure 5C:
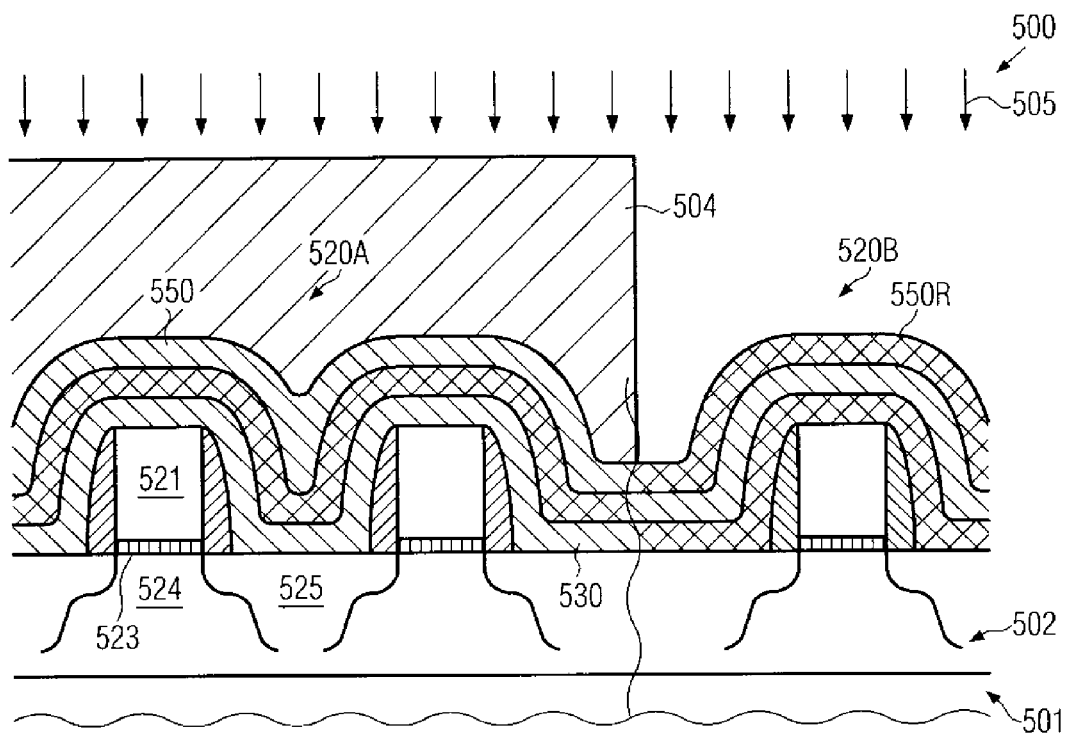

With reference to FIGS. 5a-5c, further illustrative embodiments will now be described in more detail, in which a sequence of deposition processes may be performed on the basis of a reduced target thickness, thereby enabling the provision of an increased amount of stressed material while nevertheless providing a substantially void-free deposition regime.

FIG. 5a schematically illustrates a semiconductor device 500, comprising a substrate 501 and a semiconductor layer 502, in and above which is formed a first device region 520A comprising one or more first transistors, which may also be indicated by the same reference number, and a second device region 520B including one or more second transistor elements, which may also be referred to as second transistors 520B. With respect to the substrate 501 and the semiconductor layer 502, as well as the respective transistor elements provided in the first and second device regions 520A, 520B, the same criteria may apply as previously explained with reference to the devices 300 and 400. Thus, the respective components may be denoted by the same reference numerals except for a "5" instead of a "4" or a "3" as the first digit. Furthermore, the semiconductor device 500 may comprise a first dielectric layer 530 having a reduced thickness 530T compared to the embodiments as previously described so as to provide a substantially conformal deposition behavior, even for highly scaled semiconductor devices. For example, a value for the thickness 530T may be approximately 50 nm or less, such as approximately 50-10 nm. The first dielectric layer 530 may comprise, in this manufacturing stage, a stress-inducing portion 530C having an internal stress level as desired for enhancing performance of the transistors in the first device region 520A. On the other hand, a second portion 530R may represent a substantially relaxed portion in the above-specified sense.

The semiconductor device 500 may be formed on the basis of substantially the same process techniques as previously described with reference to the devices 300 and 400, wherein, however, the deposition of the layer 530 may be performed on the basis of an appropriate process time or other process parameters so as to obtain a desired high internal stress while nevertheless maintaining the thickness 530T at a value that allows a substantially conformal deposition behavior. Thereafter, an appropriate treatment may be performed to selectively reduce or relax the internal stress in the portion 530R. Depending on the thickness 530T, appropriate processes, such as implantation, plasma treatment and the like, may be used to obtain the desired stress relaxing effect.

FIG. 5b schematically illustrates the semiconductor device 500 in a further advanced manufacturing stage, in which a second dielectric layer 540 is formed on the first dielectric layer 530 in a manner that a first portion 540R is a substantially relaxed portion, while a second portion 540T has a high internal stress to enhance performance of the transistors in the second device region 520B. The second dielectric layer 540 may be provided with an appropriate thickness so as to also enable a substantially void-free deposition, for instance, on the basis of a thickness of 50 nm and less, where the deposition parameters may, in some illustrative embodiments, be selected so as to obtain a certain degree of gap filling behavior rather than maximizing the internal stress level. In this case, the second dielectric layer 540 may act as a buffer layer, for instance similar to the layer 435, to reduce the pronounced surface topography, while nevertheless providing a moderately high internal stress level. In other illustrative embodiments, the thickness of the first and second dielectric layers 530 and 540 are selected so as to commonly result in a layer thickness that is compatible to the gap filling capabilities of the respective deposition technique, as previously explained, even for highly scaled devices, so that, within the deposition capabilities of the deposition process under consideration, both materials may be provided with high internal stress. Thereafter, one or more further layers may be provided, for instance, in combination with a buffer layer, such as the layer 435 (FIGS. 4*a* and 4*b*), so as to appropriately fill critical areas prior to forming a further material of high internal stress level.

FIG. 5*c* schematically illustrates the device 500 in accordance with further illustrative embodiments, in which a third dielectric layer 550 is formed above the second dielectric layer 540, wherein the layer 550 may have an intrinsic stress to enhance the performance of transistors in the first device region 520A or in the second device region 520B, depending on the process and device requirements. For example, the layer 550 may comprise an internal stress corresponding to the stress of the first layer 530, thereby enhancing the overall stress in the first device region 520A. In this case, the mask 504 may be provided to cover the first device region 520A and expose the second device region 520B to a stress relaxation treatment 505, thereby creating a relaxed portion 550R.

Figure 5D:
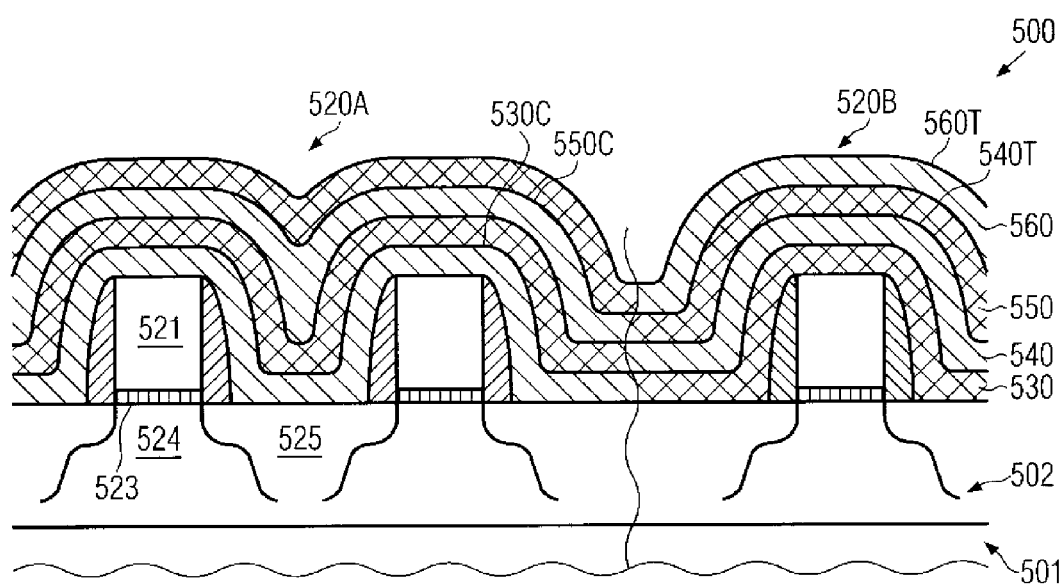

FIG. 5*d* schematically illustrates the semiconductor device 500, wherein a further dielectric layer 560 may be formed above the first and second device regions 520A, 520B. The dielectric layer 560 may comprise a substantially relaxed portion above the first device region 520A and a stress-inducing portion 560T above the second device region 520B. It should be appreciated that each of the layers 530, 540, 550 and 560 may be provided with a reduced target thickness, thereby enhancing the overall process robustness and thus reliability of each of the respective deposition processes and also of the corresponding particle bombardments for relaxing respective portions of these layers. Furthermore, at least in some of the deposition processes, for instance for the layers 530 and 540, a substantially void-free deposition may be accomplished without providing additional buffer materials. In other illustrative embodiments, a thin buffer layer (not shown) may be provided prior to the deposition of the layers 550 and 560, if the previously obtained surface topography may not be within the capability of the respective deposition process. For example, after the deposition of the layer 540, an appropriate buffer layer may be provided with a flow-like deposition behavior thereby preparing the resulting surface geometry for the deposition of one or more subsequent layers, such as layers 550, 560, without requiring any further buffer layers therebetween. In other cases, a respective buffer layer may be formed prior to the deposition of a respective stress-inducing layer. It should be appreciated that the alternating fashion of providing the layers 530, 540, 550, 560 with different internal stresses may result in a certain degree of "homogeneity" for distributing the respective stressed materials above the first and second device regions 520A, 520B.

As a result, the present disclosure provides techniques and semiconductor devices in which advantage is taken of experimental results indicating that an efficient stress transfer mechanism may be established via a substantially relaxed dielectric material, thereby enabling the individual performance enhancement of transistor devices of different conductivity type, even in highly scaled applications, for instance for semiconductor devices of the 65 nm technology node and beyond, since complex material removal processes, typically used in conventional dual stress line approaches, may be omitted, as a first stress-inducing layer may be provided as a continuous layer, a portion of which may be treated to induce stress relaxation without removing this portion, thereby contributing to overall process robustness and efficiency. Thereafter, a highly stressed dielectric material may be positioned above or directly on the relaxed portion, while nevertheless providing a desired stress transfer into the lower-lying transistors. The sequence may be repeated in accordance with device requirements. Thus, the probability for creating voids or other irregularities, as may typically be encountered in conventional dual stress liner approaches, may be significantly reduced, while also reducing process complexities. In this way, the stress transfer technique based on stressed overlayers may be scaled in accordance with the scaling of the device dimensions or the conventional dual stress liner approaches may be replaced by the techniques disclosed herein, thereby enhancing throughput and yield.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first stress-inducing layer above a first transistor and a second transistor formed above a substrate, said first stress-inducing layer generating a first type of stress;
   reducing a magnitude of said first type of stress of said first stress-inducing layer above said second transistor;
   depositing a buffer layer above said first stress-inducing layer and said first and second transistors;
   after reducing the magnitude of said first type of stress of said first stress-inducing layer, forming a second stress-inducing layer above said buffer layer while maintaining said buffer layer covering said first and second transistors, said second stress-inducing layer generating a second type of stress differing from said first type of stress, wherein said buffer layer has a thickness that is less than a thickness of said first stress-inducing layer and wherein said buffer layer is configured to reduce a surface topography above said first and second transistors; and
   forming an interlayer dielectric material above said first and second transistors, wherein said first stress-inducing layer, said buffer layer, and said second stress-inducing layer remain above at least said second transistor after forming said interlayer dielectric material.

2. The method of claim 1, wherein reducing said first type of stress comprises performing a particle bombardment above said second transistor while covering said first transistor and a portion of said first stress-inducing layer formed above said first transistor.

3. The method of claim 1, further comprising removing a portion of said second stress-inducing layer from above said first transistor.

4. The method of claim 1, further comprising selectively reducing a magnitude of said second type of stress above said first transistor while substantially maintaining said second type of stress above said second transistor.

5. The method of claim 1, wherein a portion of said second stress-inducing layer is removed from above said first transistor by performing a selective etch process and using said buffer layer for controlling said etch process.

6. The method of claim 1, further comprising forming a third stress-inducing layer above said first and second transistors, said third stress-inducing layer generating said first type of stress, and selectively reducing a magnitude of said first type of stress of said third stress-inducing layer above said second transistor.

7. The method of claim 6, further comprising forming a fourth stress-inducing layer above said first and second transistors, said fourth stress-inducing layer generating said second type of stress, and selectively reducing a magnitude of said second type of stress of said fourth stress-inducing layer above said first transistor.

8. The method of claim 6, wherein a thickness of said first stress-inducing layer is approximately 50 nm or less.

9. The method of claim 8, wherein a thickness of said second stress-inducing layers is approximately 50 nm or less.

10. The method of claim 1, wherein at least one of said first and second stress-inducing layers comprises silicon and nitrogen.

11. The method of claim 1, wherein at least one of said first and second stress-inducing layers comprise silicon and carbon.

12. The method of claim 1, wherein a gate length of at least one of said first and second transistors is approximately 50 nm or less.

13. A method, comprising:
  forming a first stress-inducing layer above a first transistor and a second transistor;
  selectively relaxing an internal stress of said first stress-inducing layer above said second transistor;
  depositing a buffer layer above said first stress inducing layer and said first and second transistors;
  after selectively relaxing the internal stress of said first stress-inducing layer, forming a second stress-inducing layer above said buffer layer while maintaining said buffer layer covering said first and second transistors, wherein said buffer layer has a thickness that is less than a thickness of said first stress-inducing layer and wherein said buffer layer is configured to reduce a surface topography above said first and second transistors;
  selectively relaxing an internal stress of said second stress-inducing layer above said first transistor; and
  forming an interlayer dielectric material above said first and second transistors, wherein said first stress-inducing layer, said buffer layer, and said second stress-inducing layer remain above at least said second transistor after forming said interlayer dielectric material.

14. The method of claim 13, further comprising forming a third stress-inducing layer above said first and second transistors, and selectively relaxing an internal stress of said third stress-inducing layer above one of said first and second transistors.

15. The method of claim 14, further comprising forming a fourth stress-inducing layer above said first and second transistors, and selectively relaxing an internal stress of said fourth stress-inducing layer above the other one of said first and second transistors.

16. The method of claim 13, wherein selectively relaxing an internal stress of at least one of said first and second stress-inducing layers comprises selectively creating a particle bombardment.

17. The method of claim 13, wherein a thickness of said first and second stress-inducing layers is less than approximately 50 nm.

18. A semiconductor device, comprising:
  a first dielectric layer formed above a first transistor and a second transistor, said first dielectric layer having a stress-inducing portion above said first transistor and a substantially relaxed portion above said second transistor;
  a buffer layer formed above said first dielectric layer and covering said first and second transistors;
  a second dielectric layer formed above said buffer layer and at least one of said first and second transistors, said second dielectric layer having a stress-inducing portion formed above said substantially relaxed portion of said first dielectric layer, wherein said buffer layer differs from said second dielectric layer by at least one of material composition or a lower strain, and wherein said buffer layer is configured to reduce a surface topography above said first and second transistors; and
  an interlayer dielectric material formed above said first-stress inducing layer, said buffer layer, and said second stress-inducing layer, wherein said first stress-inducing layer, said buffer layer, and said second stress-inducing layer are present above at least said second transistor and below said interlayer dielectric material.

19. The semiconductor device of claim 18, wherein said second dielectric layer comprises a substantially relaxed portion above said stress-inducing portion of said first dielectric layer.

20. The semiconductor device of claim 18, further comprising a third dielectric layer formed above said first and second transistors, said third dielectric layer comprising a stress-inducing portion located above one of the first and second transistors and a substantially relaxed portion located above the other one of said first and second transistors.

21. The semiconductor device of claim 18, wherein said first and second transistors have a gate length of approximately 50 nm or less.

22. The semiconductor device of claim 18, wherein said first and second dielectric layers comprise silicon and nitrogen.

23. The semiconductor device of claim 21, wherein a thickness of said first dielectric layer is approximately 150 nm or less and a thickness of said second dielectric layer is approximately 100 nm or less.

24. The method of claim 1, further comprising forming an interlayer dielectric material above said first-stress inducing layer, said buffer layer, and said second stress-inducing layer.

25. The method of claim 13, further comprising forming an interlayer dielectric material above said first-stress inducing layer, said buffer layer, and said second stress-inducing layer.

26. The method of claim 1, wherein said buffer layer generates said first type of stress, and the method further comprises reducing a magnitude of said first type of stress of said first stress-inducing layer and said buffer layer above said second transistor in a common process.

27. The method of claim 4, wherein said buffer layer generates said second type of stress, and the method further comprises reducing a magnitude of said second type of stress of said second stress-inducing layer and said buffer layer above said first transistor in a common process.

28. The method of claim 13, wherein said buffer layer comprises a stress-inducing buffer layer, and the method further comprises selectively relaxing an internal stress of said buffer layer and relaxing the internal stress in one of said first stress-inducing layer or said second stress-inducing layer in a common process.

* * * * *